(12) United States Patent
Tozer (10) Patent No.: US 8,984,906 B2
(45) Date of Patent: Mar. 24, 2015

(54) COOL DESIGN DATA CENTER

(75) Inventor: Robert M. Tozer, Kingston Upon Thames (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 1541 days.

(21) Appl. No.: 11/834,781

(22) Filed: Aug. 7, 2007

(65) Prior Publication Data

US 2008/0185446 A1 Aug. 7, 2008

(30) Foreign Application Priority Data

Feb. 7, 2007 (GB) .................................. 0702424.3

(51) Int. Cl.
*H05K 7/20* (2006.01)

(52) U.S. Cl.
CPC ........ *H05K 7/20836* (2013.01); *H05K 7/20745* (2013.01)
USPC ........... 62/259.2; 361/688; 361/690; 361/691

(58) Field of Classification Search
USPC .......................... 236/49.1, 49.3; 62/259.2, 186
See application file for complete search history.

(56) References Cited

U.S. PATENT DOCUMENTS

| | | | |
|---|---|---|---|
| 1,990,094 A * | 2/1935 | Ray .................................. | 62/91 |
| 4,379,484 A * | 4/1983 | Lom et al. ...................... | 165/251 |
| 4,765,397 A | 8/1988 | Chrysler et al. | |
| 6,374,627 B1 | 4/2002 | Schumacher et al. | |
| 6,945,058 B2 * | 9/2005 | Bash et al. ........................ | 62/89 |
| 2002/0108386 A1 * | 8/2002 | Spinazzola et al. ........... | 62/259.2 |
| 2005/0237716 A1 * | 10/2005 | Chu et al. ...................... | 361/696 |

(Continued)

FOREIGN PATENT DOCUMENTS

| | | |
|---|---|---|
| DE | 2635445 | 2/1978 |
| DE | 3624541 A1 | 1/1988 |

(Continued)

OTHER PUBLICATIONS

Danish Electricity Saving Trust. "Good Advice for Saving Electricity in the Server Room." Nov. 2004.*

(Continued)

*Primary Examiner* — Jonathan Bradford
(74) *Attorney, Agent, or Firm* — Hewlett-Packard Patent Department (57) ABSTRACT

An improved solution for cooling a data center is provided. In an embodiment of the invention, a data center design that combines physical segregation of hot and cold air streams together with a data hall variable air volume system is provided. The invention is a data center design that resolves air management issues of re-circulation, bypass and load balance. Bypass is airflow supplied by the cooling units that directly returns without cooling servers. Recirculation airflow is server discharge warm air that returns directly without being cooled. Load balance is supplying the required server airflow. An embodiment includes physical segregation of cold and hot air streams and by providing variable air volume to match server load. Air segregation is done by enclosing the hot aisle end and above the cabinets. The air conditioning system provides variable air volume to the data hall (cold side) to meet server demands. The cooling plant consists of variable-air-volume air-cooling system, which cools air by air free cooling (economizer) and is supplemented with mechanical cooling in the warmer seasons.

8 Claims, 5 Drawing Sheets

(56) References Cited

U.S. PATENT DOCUMENTS

2007/0167126 A1* 7/2007 Ghattas .................. 454/187
2009/0168345 A1* 7/2009 Martini .................. 361/691

FOREIGN PATENT DOCUMENTS

DE        20220834 U1    4/2004
WO    WO 2006/124240 A3  11/2006

OTHER PUBLICATIONS

Tozer, Robert, "Data CenterDynamics[online]: Air management Metrics", Datacenter Dynamics[online], http://datacenterdynamics (See Search Report for full address), Dec. 20, 2006.
Search Report from co-pending GB Application No. GB 0702424.3 (5 Pages).

* cited by examiner

COOL DESIGN DATA CENTER

FIELD OF THE INVENTION

Aspects of the invention relate generally to cooling systems for data centers and the design thereof, and more particularly, to a cool design data center.

BACKGROUND OF THE INVENTION

Over the last several decades data center servers have typically been cooled by means of non-centralized air conditioning units, referred to as Computer Room Air Conditioning (CRAC) units, located inside or adjacent to the data center. Some cooling system designs have used centralized constant volume Air Handling Units (AHUs).

Furthermore, the cooling load densities (W/m2) for data centers have increased substantially in line with Moore's law relating to computer chip density increase. This has led to data centers having a very high usage of energy, per surface area, in the order of at least 10 times that of typical office air conditioning applications.

To realize increased data center energy efficiency requires improvements in air management. Optimum air management requires physical segregation of hot and cold air streams and dynamically matching the supply air volume of the cooling systems (CRAC units or AHUs) with the variable demand air volume of the servers.

Whereas air free cooling is standard in Variable Air Volume (VAV) Air Handling Unit (AHU) systems used for large office air conditioning applications, it is not applied to data centers.

Data center high-density requirements have identified inefficiencies in traditional data center designs: air bypass and recirculation. Bypass is airflow supplied by the cooling units that directly returns to the cooling units without cooling the servers. Recirculation airflow is warm air discharged from a server that is delivered directly into the same or another server's air inlet without being cooled. Air management in data centers in an attempt to resolve bypass and recirculation have been addressed by vendors with packaged solutions that cool the air close to the heat source (i.e., the servers).

If air management issues of recirculation were solved, air could be supplied at higher temperatures, e.g., 22° C. to 25° C. rather than at approximately 12° C. to 15° C. (i.e., around 10K (i.e., Kelvin) lower). This potentially saves energy in the refrigeration systems, as the evaporator temperature of the refrigeration systems can be set higher.

If air management issues of bypass were solved, less air could be supplied, hence saving fan energy. Modern servers (i.e., blade type) have variable air volume controlled by a variety of internal sensors.

The design ΔT ("delta T") (airflow), wherein T represents temperature, of a typical server is 15K, but minimum load and flow rates are such that the minimum delta T is around 7K.

As a result of the in server load densities, in line with Moore's law, manufacturers are increasing loads on chips, using the same air flow rates, which will, or is predicted to, result in a future design delta T of 25K, or more. At full load, a data center could potentially require air at 25° C. and discharge it at approximately 40° C. to 50° C. (e.g., 25° C.+15K or 25K).

Given that air temperatures in many worldwide locations (e.g., United Kingdom) very seldom exceed 30° C., there are significant energy savings if air free cooling were to be used. Mechanical cooling (supplemental cooling) would only be necessary to cool air from outdoor conditions to design supply conditions, rather than from the higher return/exhaust air temperature from the servers.

In view of the foregoing, a need exists to overcome one or more of the deficiencies in the related art.

BRIEF SUMMARY OF THE INVENTION

Aspects of the invention provide an improved solution for cooling a data center. In an embodiment of the invention, a data center design that combines physical segregation of hot and cold air streams together with a data hall variable air volume system is provided. The invention is a data center design that resolves air management issues of re-circulation, bypass and load balance. Bypass is airflow supplied by the cooling units that directly returns without cooling servers. Recirculation airflow is server discharge warm air that returns directly without being cooled. Load balance is supplying the required server airflow. An embodiment includes physical segregation of cold and hot air streams and by providing variable air volume to match server load (see e.g., FIGS. 1 to 4). In an embodiment, physical segregation of hot and cold air streams is comprised of enclosing the hot aisle end(s) and above any server cabinets. The air conditioning system provides variable air volume to the data hall (cold side) to meet server demands (see e.g., FIGS. 5 and 6). The cooling plant comprises a variable-air-volume air-cooling system, which cools air by air free cooling (economizer) and is supplemented with mechanical cooling in the warmer seasons. Further design options are indicated (see e.g., FIGS. 7 to 10).

A first aspect of the invention provides a cooling system for a data center comprising: a hot air stream; a cold air stream, physically segregated from the hot air stream; and a data hall variable air volume (VAV) system.

A second aspect of the invention provides a method of cooling a data center comprising: providing a hot air stream; providing a cold air stream, physically segregated from the hot air stream; and providing a data hall variable air volume (VAV) system.

A third aspect of the invention provides a data center comprising: a plurality of servers; a system for delivering cool air to the plurality of servers via a first air stream using a variable air volume (VAV) system; and a system for exhausting hot air from the plurality of servers, via a second air stream, wherein the first air stream is physically segregated from the second air stream.

The illustrative aspects of the invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Aspects of the invention provide an improved solution for cooling a data center. In an embodiment of the invention, a data center design that combines physical segregation of hot and cold air streams together with a data hall variable air volume system is provided. The invention is a data center design that resolves air management issues of re-circulation, bypass and load balance. Bypass is airflow supplied by the cooling units that directly returns without cooling servers. Recirculation airflow is server discharge warm air that returns directly without being cooled. Load balance is supplying the required server airflow. An embodiment includes physical segregation of cold and hot air streams and by providing variable air volume to match server load (see e.g., FIGS. 1 to 4). In an embodiment, physical segregation of hot and cold air streams is comprised of enclosing the hot aisle end(s) and above any server cabinets. The air conditioning system provides variable air volume to the data hall (cold side) to meet server demands (see e.g., FIGS. 5 and 6). The cooling plant comprises a variable-air-volume air-cooling system, which cools air by air free cooling (economizer) and is supplemented with mechanical cooling in the warmer seasons. Further design options are indicated (see e.g., FIGS. 7 to 10).

As indicated above, aspects of the invention provide an improved solution for cooling a data center. In an aspect of the present invention, energy is saved by directly using outside air to cool; this is the primary source of cooling. This means air only has to be cooled from the outdoor ambient conditions rather than from the higher server discharge temperatures. Energy is further saved by having variable air flow and also due to larger plants with low air velocities that result in lower air pressure drops.

Further, data center hot spot issues (e.g., uneven supply air temperatures to servers) are eliminated by having positive segregation of hot and cold air streams.

Given that mechanical cooling is only applied as supplemental cooling but air is supplied at higher temperatures than standard designs, this increases the feasibility of using more energy efficient systems such as free-cooling on the coolant side or water side (economiser cycles) and more efficient refrigeration temperatures. Aspects of the present invention provide improved design reliability: as most of the cooling is from outdoor air, supplemented by mechanical cooling, which is more reliable than a solely mechanical cooling system. Aspects of the present invention provide improved resilience: as the system is simple and therefore easy to operate by facility engineers and managers. In any event, the present invention provides an improved solution for cooling a data center.

A cold aisle 12/hot aisle 14 principle is used that comprises having entire aisles 12, 14 dedicated to cold or hot air, so that servers 21 use cold air from the cold aisle 12 and supply it to the hot aisle 14. However, in this case physical segregation of cold and hot air streams is achieved by enclosure 15 of the hot aisle 14 and connecting it directly to the ceiling/return plenum 22 located above the data center 9. The hot aisle 14 enclosure 15 is done by closing off the ends and providing an access door at each end of the hot aisle 14 and by panel enclosure 15 above the cabinets 20 up to the ceiling. The entire data center 9 could become 'the cold aisle' 12, with exception of the server cabinets 20, a plant 26 and hot aisles 14, which are isolated and enclosed via, for example, enclosures 15. See FIG. 2.

Figure 1:
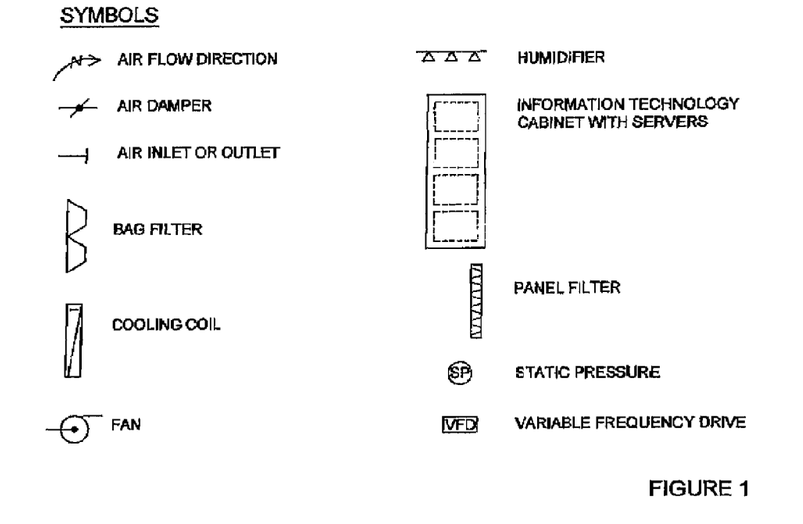
FIG. 1 shows the symbols used in the subsequent figures.
Figure 2:
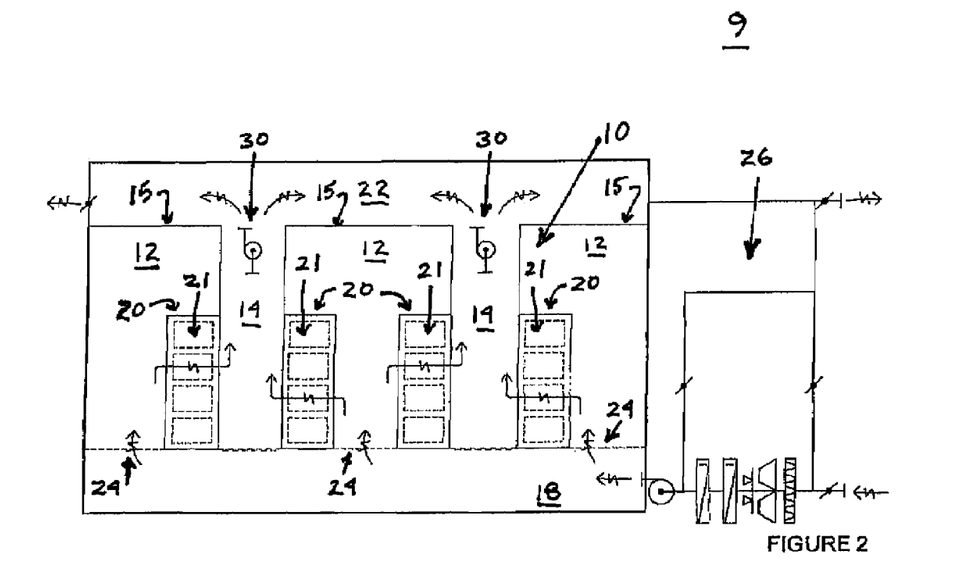
FIG. 2 shows an elevation sectional view of how the air is circulated between the plant and the servers in the data center, in accordance with an embodiment of the present invention.
Figure 3:
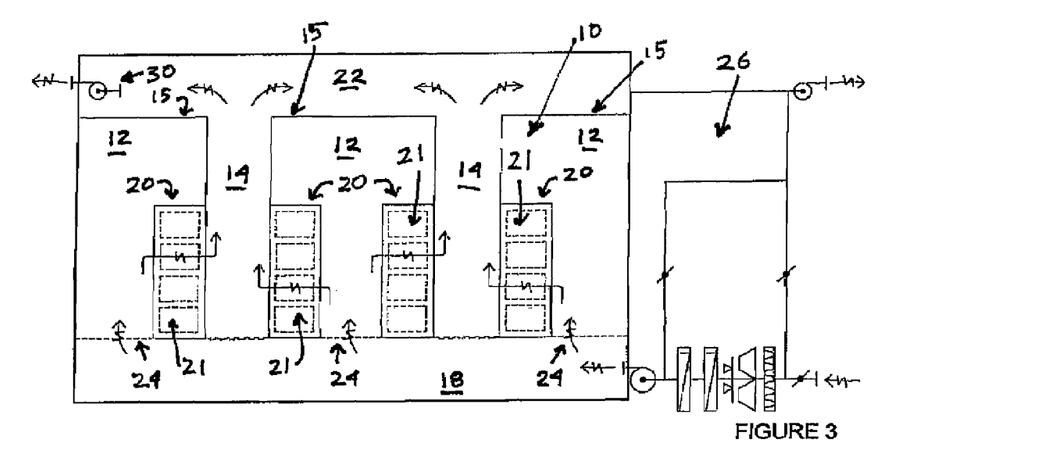
FIG. 3 shows an elevation sectional view of alternative embodiment to FIG. 2 whereby the return fans are replaced by extract fans, in accordance with another embodiment of the present invention.

Air is supplied from the plant 26 to the raised floor plenum 18, from which air is supplied to the data hall 10 via floor grilles 24. These are located in the cold aisles 12 and could extend to the entire data hall 10 except where there are cabinets 20, hot aisles 14 and floor mounted plant 26 such as switchboards, panels, etc.

Air from the cold aisle 12 is then supplied to the servers 21 in the cabinets 20 (via perforated doors or directly to the front of the cabinet 20). The cabinets 20 and data hall 10 shall be designed so that air is unable to go anywhere else than into the server 21 air inlet. This will require the server cabinets 20 to have unused space sealed with blanking panels and brushes fitted at cable penetrations, etc., as necessary. The data hall 10 will require a smoke test during commissioning stages to identify and resolve all sources of air leaks between the cold and hot air streams.

The servers 21 will warm the air and supply it via their own variable volume fans to the hot aisle 14 enclosure. From this enclosure air will circulate up towards the ceiling/return plenum 22 preferably with re-circulation fans. The general principle is that air moves from bottom (cold air) to top (hot air) in the data hall 10.

From the return plenum 22 the hot air is either discharged to outside (with our without exhaust fans) or partially/totally returned to the cooling plant 26 where it can be mixed with outdoor fresh air and cooled if necessary before re-supplying it to the data hall 10 at the design condition.

Figure 4:
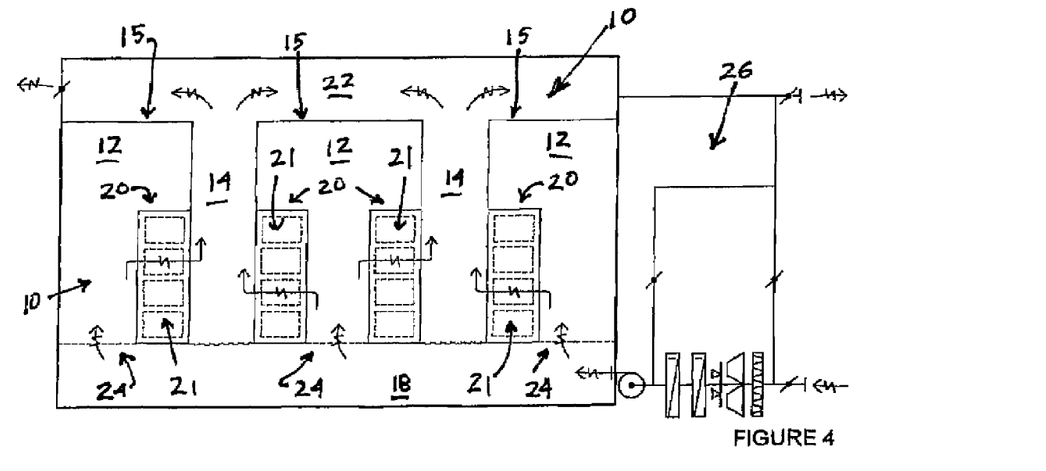
FIG. 4 shows an elevation sectional view of alternative embodiment to FIG. 2 whereby there are no return air or extract fans, in accordance with another embodiment of the present invention.

Air movement requires the AHU fans to operate in series with the server 21 fans and with recirculation fans and or extract fans (if used). The system can work with any of the following options depending on the design, server 21 fans and extent of positive pressure required in the data center 9 (in increasing order of data hall 10 positive pressure and decreasing order of pressure control):

Return variable air volume fans 30 located in return plenum 22 to ceiling void (FIG. 2), or Extract variable air volume fans 30 connected between return plenum 22 and outdoors (FIG. 3), or No return or extract fans (FIG. 4).

In order to maintain high levels of reliability and to avoid single points of failure in the design the following control principle is maintained: 'local control' and 'global monitoring'. The invention avoids any global controlling as all controls are per each piece of plant equipment ("plant"), e.g., air handling units, return fans, extract fans, etc.

Also, the design will avoid small number of plant so to minimize the impact on the overall data center ambient conditions when plant (e.g., AHUs) fail.

Supply air needs to be carefully filtered, as it mainly uses outdoor air as a cooling source. Therefore, like most VAV AHU systems the filters will normally include panel pre-filters followed by higher standard filters typically used in data centers 9 (panel filters) or bag filters.

Whilst for energy saving purposes humidity should be controlled to a wide range, air will nevertheless require humidification, particularly at low outdoor air temperature conditions. Humidification should be provided to the supply air plant (AHU units) either to the supply air or to the return air, which will be warmer. Adiabatic spray coolers will also wash the outside air. Humidity levels should be controlled based on the supply air conditions of each AHU.

The AHUs should be designed to maintain a larger cross section thus achieving low air velocities and low velocity pressures at the AHU outlet. Measuring static pressure near the AHU outlet will provide local static pressure control of fans. Designers should not follow the principle of minimizing the size of the cooling plant to reduce capital cost which will be offset by operating costs as this will increase energy usage and reduce controllability of airflow and static pressures.

The cooling coil will require to be cooled by an external mechanical cooling system such as adiabatic coolers, cooling towers, adiabatic air spray (direct or indirect systems), or chillers. Depending on the air conditions the cooling coil is also used to dehumidify if necessary. As an option, a second cooling coil fed from an independent cooling system can be added to the AHU as a standby to the first coil and its cooling system.

The control system shall operate each AHU individually and global controls not used thus avoiding single points of failure. The controls will be based on the internal envelope and the outdoor conditions. The internal envelope can be represented on a psychrometric chart as a rectangle defined by a range of dry bulb temperatures from $T_L$ (low temperature) to $T_H$ (high temperature) and a range of absolute humidities ranging from $W_L$ (low humidity) to $W_H$ (high humidity). The larger this internal envelope is made, the more energy saving can be achieved. The projections at constant temperature, absolute humidity and enthalpy from the internal envelope define the control modes in which the AHU can operate. These are quite different from the standard office VAV system and requires a different system architecture. The difference is due to that office VAV supply air at off-coil conditions near to humidity saturation, whereas data center VAV system need to supply air nearer to 50% relative humidity. One of the control options requires outdoor air to be cooled and dehumidified before mixing with return air that requires a further ductwork connection and air damper.

Figure 5:
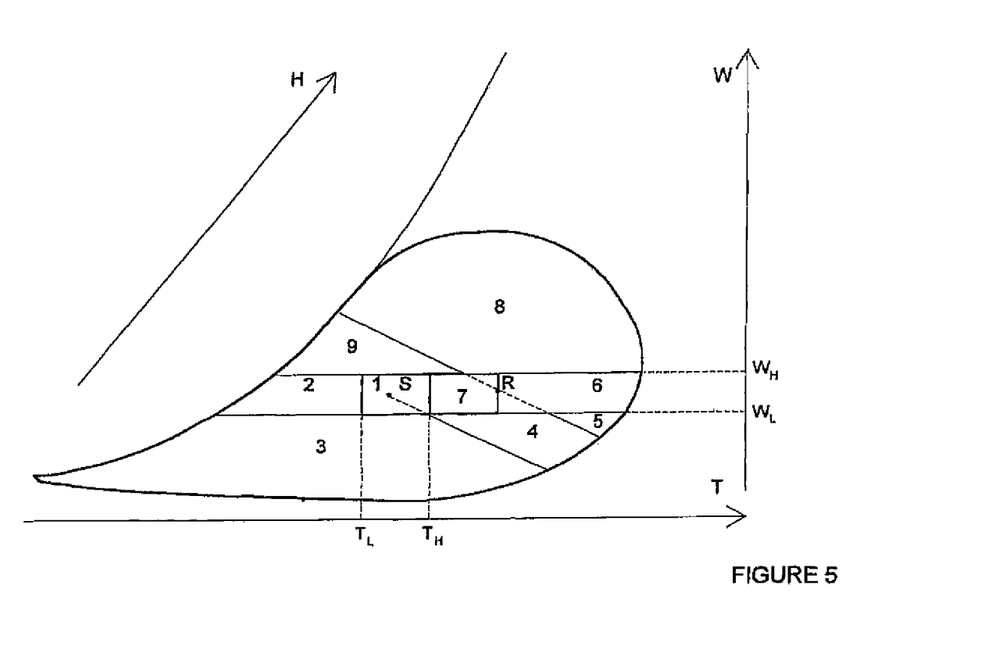
FIG. 5 shows the different control options in terms of the outdoor ambient envelope conditions, in accordance with an embodiment of the present invention.

The generic control modes are as follows (see FIG. 5):

| No in FIG. 5 | Outdoor Conditions | Control mode |
| --- | --- | --- |
| 1 | Inside indoor control envelope | Supply 100% outdoor air |
| 2 | Lower temperature than $T_L$ Humidity between $W_H$ and $W_L$ | Mix return air with outdoor to achieve indoor envelope conditions |
| 3 | Enthalpy lower than supply air S Humidity lower than $W_L$ | Mix return air with outdoor air to room enthalpy Humidify (adiabatic) to indoor envelope |
| 4 | Enthalpy between supply air S and return air R conditions Humidity lower than $W_L$ | Humidify (adiabatic) 100% of outdoor air, then cool to indoor envelope |
| 5 | Enthalpy higher than return air R conditions Humidity lower than $W_L$ | Cool 100% return air to indoor envelope |
| 6 | Higher temperature than return air R Humidity between $W_H$ and $W_L$ | Cool 100% return air to indoor envelope |
| 7 | Temperature between $T_H$ and return air R Humidity between $W_H$ and $W_L$ | Cool 100% outdoor air to indoor envelope |
| 8 | Enthalpy higher than return air R Humidity higher than $W_H$ | Cool 100% return air to indoor envelope |
| 9 | Enthalpy lower than return air R Humidity higher than $W_H$ | Cool and dehumidify outdoor air, then mix with return air to indoor envelope |

Figure 6:
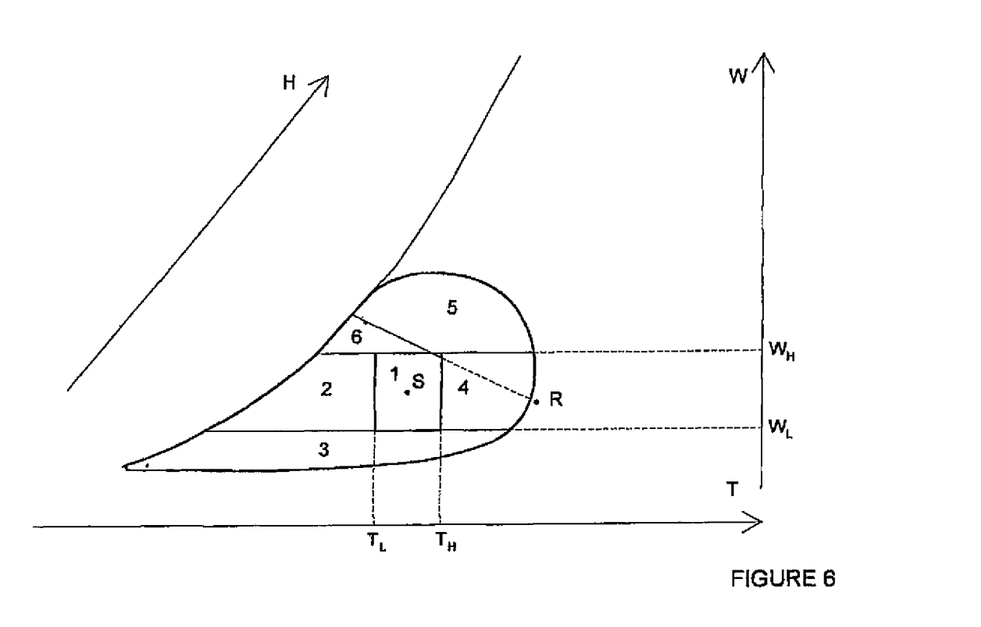
FIG. 6 shows the control options more applicable to milder climatic (e.g., United Kingdom, etc.) outdoor conditions, in accordance with another embodiment of the present invention.

Specific external envelope for different locations will normally not require all of the above control modes. For example, for the UK the control modes can be simplified to the following (see FIG. 6):

| No in FIG. 6 | Outdoor Conditions | Control mode |
| --- | --- | --- |
| 1 | Inside indoor control envelope | Supply 100% outdoor air |
| 2 | Lower temperature than $T_L$ Humidity between $W_H$ and $W_L$ | Mix return air with outdoor to achieve indoor envelope conditions |
| 3 | Humidity lower than $W_L$ | Mix return air with outdoor air to room enthalpy Humidify (adiabatic) to indoor envelope |
| 4 | Temperature higher than $T_H$ Humidity between $W_H$ and $W_L$ | Cool 100% outdoor air to indoor envelope |
| 5 | Enthalpy higher than return air R Humidity higher than $W_H$ | Cool 100% return air to indoor envelope |
| 6 | Enthalpy lower than return air R Humidity higher than $W_H$ | Cool and dehumidify outdoor air, then mix with return air to indoor envelope |

The AHU fans and critical cooling plant equipment (e.g., adiabatic spray or other) should be treated as critical plant equipment with Uninterrupted Power Supply (UPS) systems and or dual electric supplies in accordance with the server criticality. Should the means of cooling fail (cooling plant or adiabatic cooling) the system can default to free cooling and the remaining source of cooling.

The return fans circulate air from the hot aisle 14 to the return/ceiling plenum 22 and to the exhaust point or supply air plant 26. Though these fans can be of any type they are expected to be of high air volume and low head and hence axial fans would be more appropriate than others. These fans will have variable speed drives and automatic non-return dampers to avoid back-flow air circulation when the fan is not operating. Individual differential pressure sensors between the hot and cold aisle control the fan speed. These are set to a relatively low-pressure set point so to avoid imposing pressure demands on the server fans. In all cases the pressure in the cold aisle 12 should be slightly higher than the pressure in the hot aisle 14 so to avoid hot air recirculation into the data hall 10 through leakage from the hot aisle 14. Control fighting is avoided by using proportional control without integral control.

Extract fans are ideal for controlling the absolute static pressure in the data center and their variable speed fans should be controlled in this way. Like the return fans, these should have automatic non-return dampers to avoid back air circulation when the fan is not operating. The controls should be individual although some may be grouped up in some instances. Individual differential pressure sensors between the data hall (cold aisle) and exterior control the fan speed. Control fighting is avoided by using proportional control without integral control.

The floor void space 18 and ceiling height will vary with load density. The floor void can be increased to such a height that it is able to include mechanical and electrical plant 26. To avoid the risk of local fire affecting the entire data hall 10, plant 26 can be enclosed in plant rooms and ventilated with the supply air to the data center 9. In the event of a fire in these plant rooms, their individual fire system will take over and isolate it from the floor plenum 18 by use of fire dampers. The plant rooms may be naturally or mechanically ventilated (see FIG. 7).

Figure 7:
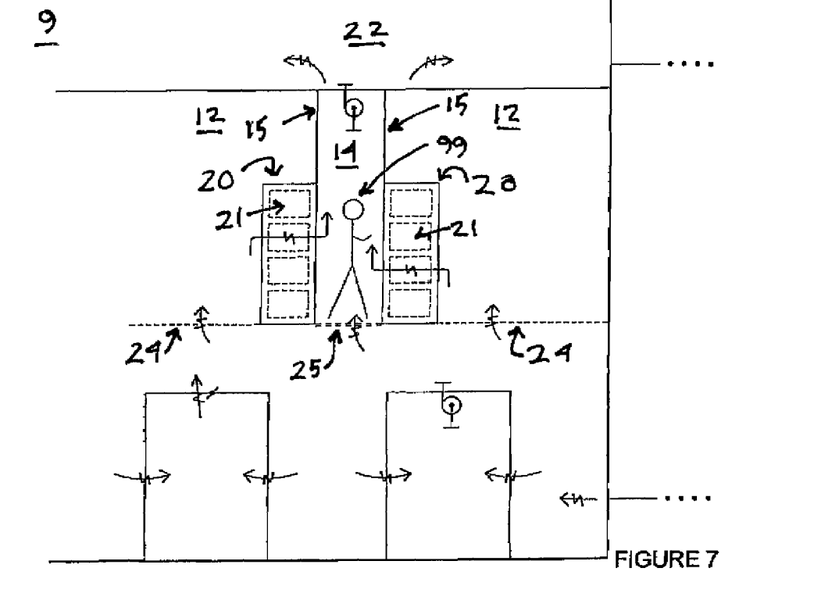
FIG. 7 shows an elevation sectional view of how plant rooms can optionally be built into the supply plenum and how the hot aisle can be cooled to work, in accordance with another embodiment of the present invention.

FIG. 7 also shows how personnel 99 can work inside the hot aisle 14 by opening the (normally closed) floor grilles 25 (automatically or manually) so that supply air enters and reduces the hot aisle 14 temperature. The return fans need to be sized for when personnel 99 work in the hot aisle 14. Special care should be taken to ensure that the hot aisle 14 floor grilles 25 are not left open unnecessarily, as this will require more fan energy.

The cooling and extract systems can be located on both, opposite and same sides of the data center 9.

With regard to noise, sound attenuators can be fitted in different locations depending on what is being protected. If the data hall 10 users (inside the hall 10) are being protected, sound attenuators should be located between the fans and the data hall 10. If the outside environment is being protected, sound attenuators should be located between the fans and the outdoor environment.

Other energy saving schemes (that globally set airflow rates and reset their temperatures) can be used as a primary control system in conjunction with this system as long as this system remains as a secondary default and backup system.

Modular concepts and pre-fabrication (off-site) may be also applied to the concepts of this invention. This applies to the following:

Prefabricated modular data hall 10 sectors
Packaged air conditioning units

Prefabricated modular data hall 10 sectors are made up of all the relevant plant, controls, components, fixings and fittings of a section of corresponding cold aisle/server cabinets/hot aisle/server cabinets/cold aisle. The main components are:

Two rows of cabinets (including blanking plates and brushes) 20 adjacent to a hot aisle 14
Hot aisle 14 enclosure 15 at each end of the aisle (including door)
Hot aisles 14 connection to ceiling plenum 22 with return fans, controls, etc
Ceiling plenum 22 corresponding to hot aisle 14, adjacent cabinets 20 and corresponding section of cold aisle 12
Fill in supply air tiles and corresponding ceiling tiles and support structure
Raised floor structure to support cabinets 20, hot aisle 14, cold aisle 12 and ceiling connection, and corresponding ceiling and floor tiles.

Figure 9:
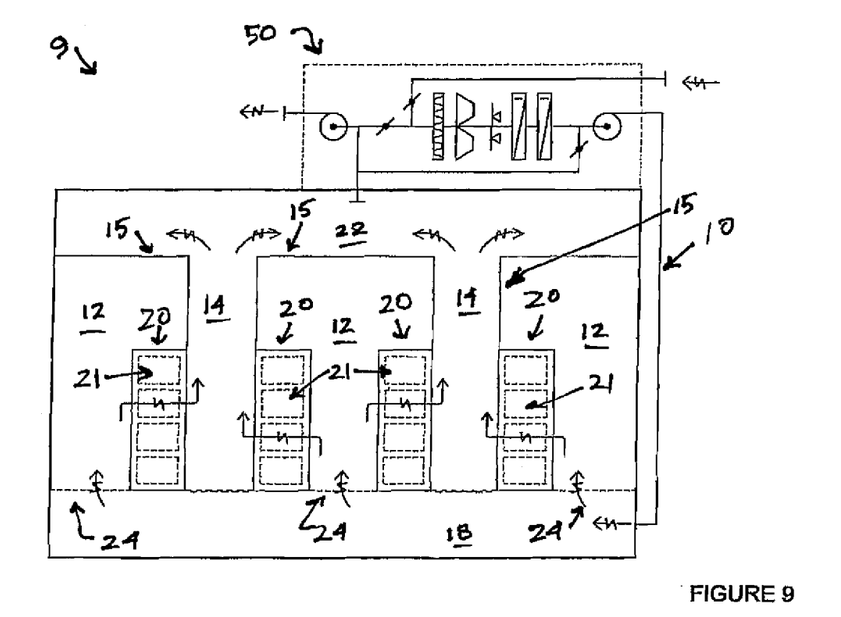
FIG. 9 shows an elevation sectional view of an alternative design with rooftop cooling units, in accordance with another embodiment of the present invention.
Figure 10:
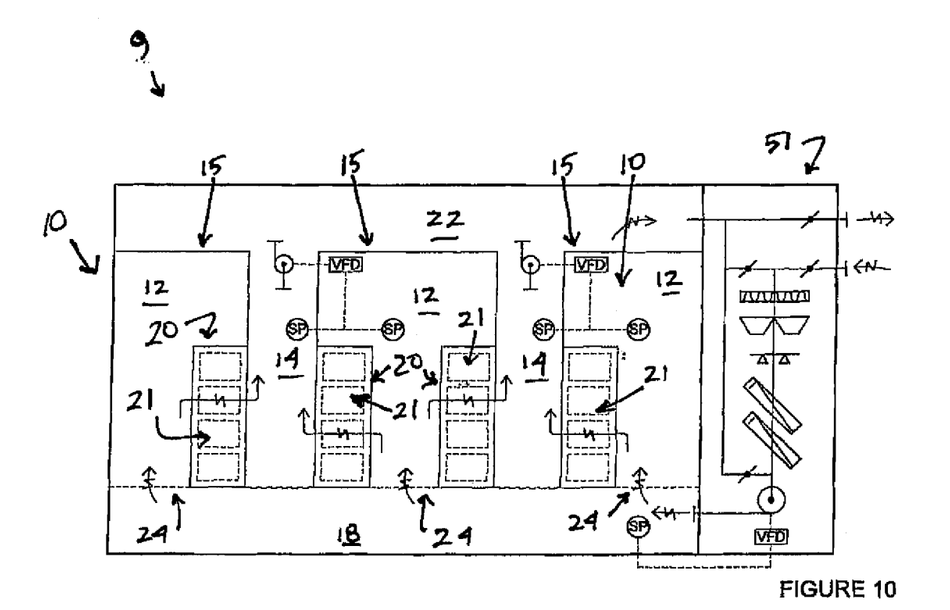
FIG. 10 shows an elevation sectional view of an alternative design with computer room air conditioning (CRAC) units, in accordance with another embodiment of the present invention.

Packaged air conditioning units are built off site in accordance with this AHU design and include systems such as Roof Top air conditioning units 50 (see FIGS. 8 and 9) and Computer Room Air Conditioning (CRAC) units 51 (see FIG. 10).

Figure 8:
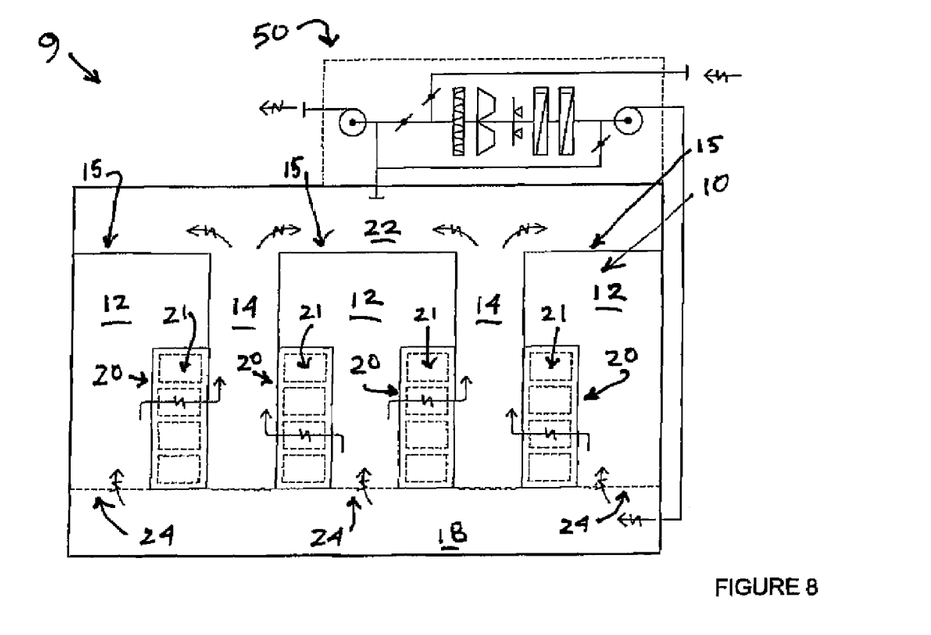
FIG. 8 shows an elevation sectional view of how the centralized cooling plant can be built into rooftop cooling units, in accordance with another embodiment of the present invention.

Furthermore, these packaged air conditioning units 50, 51 are designed as either indoor or outdoor units. Indoor units may be located inside the data hall 10, adjacent to the data hall 10, or remotely. Outdoor packaged air conditioning units can be located on the roof of the data hall 10 (roof top units), adjacent to the data hall 10 or remotely.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A cooling system for a data hall comprising:
   an enclosed hot aisle accommodating a hot air stream, the hot aisle comprising an exhaust opening formed at one end thereof through which the hot air stream exits the hot aisle;
   a cold aisle accommodating a cold airstream, the cold aisle being physically segregated from the hot air aisle, the cold aisle directly connected to a supply plenum, said supply plenum selectively receiving ambient air from an outdoor environment based on climatic outdoor conditions;
   a hot aisle plenum in direct physical contact with the exhaust of the hot aisle and segregated from the supply plenum, wherein complete elimination of hot and cold air counterflow is achieved between the hot air exiting the exhaust of hot aisle and cold air in the cold aisle and the supply plenum;
   a data hall variable air volume (VAV) system; and
   wherein said hot aisle plenum further comprises both an exhaust to said outdoor environment and a return to a conditioning system of said supply plenum such that said hot airstream can be selectively exhausted outdoors and provided to said conditioning system based on said climatic outdoor conditions;
   in which a control envelope defines a temperature, humidity and enthalpy for air provided by said supply plenum, wherein said air conditioning system selectively conditions air from the outdoor environment, air from the hot airstream or a mixture thereof based on whether said climatic outdoor conditions are within said control envelope.

2. The cooling system of claim 1, wherein, if said climatic outdoor conditions include any of:
- enthalpy higher than the hot airstream and humidity lower than a minimum threshold,
- temperature higher than the hot airstream and humidity between a minimum and maximum threshold, and
- enthalpy higher than the hot airstream and humidity higher than a maximum threshold;

then, said air conditioning system cools air from said hot airstream to within parameters of said control envelope, which air is then provided through said supply plenum exclusive of said air from the outdoor environment.

3. The cooling system of claim 1, wherein, if said climatic outdoor conditions include a temperature below a minimum threshold, then said air conditioning system mixes air from said hot airstream with said air from the outdoor environment to reach a temperature within parameters of said control envelope.

4. The cooling system of claim 1, wherein, if said climatic outdoor conditions include an enthalpy lower than that of said cold airstream and a humidity below a minimum threshold, then said air conditioning system mixes air from said hot airstream with air from the outdoor environment to an enthalpy of said cold airstream and humidifies the mixed air to satisfy parameters of said control envelope.

5. The cooling system of claim 1, wherein, if said climatic outdoor conditions include an enthalpy between than of said hot and cold airstreams and a humidity lower than a minimum threshold, then said air conditioning unit humidifies and cools air from the outdoor environment for said supply plenum.

6. The cooling system of claim 1, wherein, if said climatic outdoor conditions include a temperature higher than that of said hot airstream but lower than a maximum threshold and a humidity between minimum and maximum thresholds specified by said control envelope, then said cooling system will exhaust all of the hot airstream to the outdoor environment and the air conditioning system will cool ambient air from the outdoor environment for the supply plenum.

7. The cooling system of claim 1, wherein, if said climatic outdoor conditions include an enthalpy lower than that of said hot airstream and a humidity above a maximum threshold, then said air conditioning system will cool and dehumidify the air from the outdoor environment and then mix in air from the hot airstream to produce air for said supply plenum.

8. A cooling system for a data hall comprising:
- an enclosed hot aisle accommodating a hot air stream, the hot aisle comprising an exhaust opening formed at one end thereof through which the hot air stream exits the hot aisle;
- a cold aisle accommodating a cold airstream, the cold aisle being physically segregated from the hot air aisle, the cold aisle directly connected to a supply plenum, said supply plenum selectively receiving ambient air from an outdoor environment based on climatic outdoor conditions;
- a hot aisle plenum in direct physical contact with the exhaust of the hot aisle and segregated from the supply plenum, wherein complete elimination of hot and cold air counterflow is achieved between the hot air exiting the exhaust of hot aisle and cold air in the cold aisle and the supply plenum;
- a data hall variable air volume (VAV) system; and
- wherein said hot aisle plenum further comprises both an exhaust to said outdoor environment and a return to a conditioning system of said supply plenum such that said hot airstream can be selectively exhausted outdoors and provided to said conditioning system based on said climatic outdoor conditions;
- in which a control envelope defines a temperature, humidity and enthalpy for air provided by said supply plenum, wherein, if said climatic outdoor conditions are within said control envelope, then only said ambient air from the outdoor environment is provided through said supply plenum.

\* \* \* \* \*